United States Patent
Nagata et al.

[11] Patent Number: 5,880,795
[45] Date of Patent: Mar. 9, 1999

[54] LIQUID CRYSTAL DISPLAY MODULE AND PROJECTION-TYPE LIQUID CRYSTAL DISPLAY DEVICE

[75] Inventors: Tetsuya Nagata, Hitachinaka; Iwao Takemoto, Mobara; Toshio Miyazawa, Chiba; Katsutoshi Saito; Atsumu Iguchi, both of Mobara, all of Japan

[73] Assignees: Hitachi, Ltd., Tokyo; Hitachi Device Engineering Co., Ltd., Mobara, both of Japan

[21] Appl. No.: 851,456

[22] Filed: May 5, 1997

[30] Foreign Application Priority Data

May 10, 1996 [JP] Japan ................................. 8-116285
May 10, 1996 [JP] Japan ................................. 8-116299

[51] Int. Cl.[6] .......................... G02F 1/133; G02F 1/1345
[52] U.S. Cl. ........................... 349/58; 349/60; 349/150
[58] Field of Search .................... 349/58, 60, 5, 349/149, 150, 152, 158; 361/681, 730, 736; 439/66, 67; 345/903, 905

[56] References Cited

U.S. PATENT DOCUMENTS

| | | | |
|---|---|---|---|
| 4,042,861 | 8/1977 | Yasuda et al. | 349/150 |
| 4,422,728 | 12/1983 | Andreaggi | 349/60 |
| 5,168,384 | 12/1992 | Genla | 349/150 |
| 5,358,412 | 10/1994 | Maurinus et al. | 439/66 |
| 5,406,399 | 4/1995 | Koike | 349/60 |
| 5,416,390 | 9/1992 | Wong | 349/60 |
| 5,659,376 | 8/1997 | Vehara et al. | 349/60 |
| 5,703,665 | 12/1997 | Muramatsu et al. | 349/60 |
| 5,710,607 | 1/1998 | Iwamoto et al. | 349/60 |

*Primary Examiner*—Hung Xuan Dang
*Assistant Examiner*—Tai V. Duong
*Attorney, Agent, or Firm*—Antonelli, Terry, Stout & Kraus, LLP

[57] ABSTRACT

A reflection-type liquid crystal display module has a liquid crystal panel including a first substrate of, for example, a rectangular shape, a second substrate opposed to the first substrate and a liquid crystal layer provided in a space between the first substrate and the second substrate to form a display screen, a package for encasing and holding the liquid crystal panel while maintaining the first substrate in an exposed state and a dichroic prism to which the first substrate is attached. At least two sides each of the first substrate have a side edge extruding outwardly over a corresponding side end of the second substrate. The side edges of the first substrate are fixed between the dichroic prism and the package, whereby the second substrate is supported by the first substrate and not by the package.

5 Claims, 6 Drawing Sheets

LIQUID CRYSTAL DISPLAY MODULE AND PROJECTION-TYPE LIQUID CRYSTAL DISPLAY DEVICE

BACKGROUND OF THE INVENTION

The present invention relates to a liquid crystal display module capable of suppressing changes in the gap for the liquid crystal layer in a liquid crystal display module, where a liquid crystal panel is mounted on a package, thereby displaying high quality images, and also relates to a projection-type liquid crystal display device.

Liquid crystal panels are widely used as display devices for television receivers, monitors for information equipment such as personal computers, etc. and other various display means. In such a liquid crystal panel, a driving electrode serving as a power supply electrode for pixel selection or as a power supply electrode for a switching element is provided on one of a pair of substrates, and a common electrode is provided on another substrate, these two substrates being opposed to each other while making these two electrodes face each other, and a liquid crystal layer is provided into the resulting gap between the bonded substrates.

A small size, high precision liquid crystal panel using P-Si (polysilicon) TFT is known as a typical small size, high precision liquid panel applicable to an image-forming means for a projection-type liquid crystal display device, a view finder for video camera or head-mount display, etc.

It is also known to provide a common electrode on a transparent substrate and a driving electrode on a silicon substrate, provide a liquid crystal layer or a liquid crystal layer of polymer dispersion type into the gap between the opposed substrate and encase the resulting liquid crystal panel in a package to make a module.

Conventional mounting of a liquid crystal panel on a package for making a module is based on a package structure having an opening in a display region to enclose two substrates therein, where the liquid crystal panel and the package are fixed to each other by an adhesive.

In a small size liquid crystal panel for use in such a type of module, terminals of a flexible printed substrate are connected to the corresponding lead terminals provided by patterning on one side of the driving substrate of the liquid crystal panel to supply power at various desired voltages to the driving electrode, whereas power to the common electrode is supplied through a conductive paste provided between the common substrate and the driving substrate.

FIG. 8 is an expanded perspective view showing a typical structure of the conventional small size liquid crystal panel, and FIG. 9 is a cross-sectional view along line IX—IX of FIG. 8.

In FIGS. 8 and 9, numeral 1 denotes a transparent substrate (common substrate, which may be hereinafter also referred to as first substrate), 1a a transparent common electrode formed on the inner surface of the first substrate, 2 a silicon substrate (driving substrate, which may be hereinafter also referred to as second substrate), 2a pixel electrodes formed on the inner surface of the second substrate, 3 a liquid crystal layer, 4 a seal for sealing the liquid crystal between the first substrate and the second substrate, 6 an adhesive layer of ultraviolet-curing adhesive, thermosetting resin adhesive, silver paste or the like, 7 a package of ceramics or plastics, 9 a flexible printed substrate, 5 contacts and 2b connection terminals.

In case of the conventional liquid crystal display module, the recess surface of package 7 and second substrate 2 are fixed to each other by adhesive layer 6, as shown in FIG. 9. In case of a polymer dispersed liquid crystal panel using a silicon substrate as second substrate 2, second substrate 2 is fixed to package of ceramics by a silver paste as used in die bonding.

Liquid crystal layer 3 provided in a space between first substrate 1 and second substrate 2 is driven by an electric field developed between individual pixel electrodes 2a in a pixel area and common electrode 1a. Generally, connection terminals 2b are provided on second substrate 2 and voltages for driving the individual pixel electrodes, etc. are supplied thereto externally. Voltage is also supplied to common electrode 1a on the first electrode 1, but since those similar to connection terminals 2b are not provided on the first substrate 1, wiring conductors are provided between a predetermined part of connection terminals 2b and contacts 5, so that electrical connection to common electrode 1a of first substrate 1 is made at contact 5. For this electrical connection, conductive paste as a conductive adhesive such as silver paste, etc. which is a conductive connection member.

FIG. 10 is a cross-sectional view showing one typical structure of applying to a dichroic prism, a reflection-type liquid crystal display module whose liquid crystal panel is fixed to the package, as shown in FIG. 9, where a numeral 1 designates a first substrate, 2 a second substrate, 6 an adhesive, 7 a package, 26 a dichroic prism, 27 a reflection-type liquid crystal display module and 31 an optical paste.

In FIG. 10, second substrate 2 is fixed to package 7 by thermosetting adhesive layer 6 to make a reflection-type liquid crystal display module, and first substrate 1 is closely fixed to dichroic prism 26 by optical paste 31.

Silicone oil, etc. whose refractive index is approximately equal to that of dichroic prism 26, are used as optical paste 31 to prevent generation of reflected light at the boundary between first substrate 1 and dichroic prism 26, and prevent the resulting light intensity loss, projected image contrast decrease, etc.

FIG. 11 is a schematic view of an optical system showing a typical projection-type liquid crystal display device using a liquid crystal display module, where numeral 20 designates a light source, 21 a parabolic mirror, 22 a condenser lens, 23 a reflector mirror, 24 a first aperture, 25 a lens, 26 a dichroic prism, 27R a reflection-type liquid crystal display module for red, 27G a reflection-type liquid crystal display module for green, 27B a reflection-type liquid crystal display module for blue, 28 a second aperture, 29 a projector lens and 30 a screen.

The structure of projection-type liquid crystal display device, as shown in FIG. 11 will be explained below.

Reflection-type liquid crystal display module for red 27R, reflection-type liquid crystal display module for green 27G and reflection-type liquid crystal display module for blue 27B are closely applied to three faces of dichroic prism 26, respectively, by optical paste 31 as explained referring to FIG. 10 and fixed thereto by a fixing means (not shown in the drawing) after positional adjustment so as not to be out of their right positions. These reflection-type liquid crystal display modules must be firmly fixed to the dichroic prism so that they may not be deviated from their right positions due to vibrations or shocks during working or transportation of the projection-type liquid crystal display devices. Thus, a means of pressing the respective reflection-type liquid crystal display modules 27R, 27G and 27B against the dichroic prism is used as the fixing means.

In the projection-type liquid crystal display device with such a structure, light from light source 20 is made parallel beams by parabolic mirror 21, and then enters dichroic prism 26 as incident light through condenser lens 22, reflector mirror 23, first aperture 24 and lens 25.

The incident light is split into three colors, i.e. red, green and blue, by dichroic prism 26, and the split colors enter as incident light reflection-type liquid crystal display module for red 27R, reflection-type liquid crystal display module for green 27G and reflection-type liquid crystal display module for blue 27B, each of which is fixed to the three faces of dichroic prism 26, respectively.

Images are formed on each of reflection-type liquid crystal display modules for red 27R, reflection-type liquid crystal display module for green 27G and reflection-type liquid crystal display module for blue 27B by signals supplied through said flexible printed substrate 9, and the incident light is modulated by the formed images. Reflected lights from the modules 27R, 27G and 27B are combined by dichroic prism 26 and emitted through lens 25.

Such reflection-type liquid crystal display modules can take a scattering state or a reflection state for each pixel according to image signals and can emit mirror reflections through said lens 25. The combined light to three colors emitted through lens 25 passes through the second aperture, whereby scattered lights, among reflected lights, are shut off from the scattering sites in the display region or from the circumference of the display region to project the combined light onto screen 30. Since a uniform dark state area is formed at the circumference of the display region, an image display of high image quality can be obtained. In this manner, full color images of high quality synthesized from the respective color images formed on said reflection-type liquid crystal display module for red 27R, reflection-type liquid crystal display module for green 27G and reflection-type liquid crystal display module for blue 27B can be reproduced on screen 30.

SUMMARY OF THE INVENTION

The above-mentioned structure of the conventional liquid crystal display module has such problems, when a stress is applied to the package (for example, at the time when liquid crystal display modules are fixed to a dichroic prism), that the stress is also transferred to the liquid crystal panel fixed to the interior of the package, resulting in a change in the gap or space between the two substrates that constitute the liquid crystal panel and a consequent change in the thickness of liquid crystal layer, causing considerable display failure such as uneven display, etc.

Furthermore, the above-mentioned structure of the conventional liquid crystal panel has such problems that, since the electrical connection (for supplying a required voltage) between the electrode on driving substrate 2 as the second substrate and the electrode (common electrode 1a) on common substrate 1 as the first substrate makes use of a bonding connection at contacts 5, using a conductive paste as a conductive bonding member, a local stress is developed on the electrical connection between these two electrodes, resulting in a change in the gap or space for the liquid crystal layer, causing a display failure. This is particularly remarkable when such a liquid crystal display module is applied to a projection-type liquid crystal display device.

In a large size, direct viewing type liquid crystal panel, plastic beads or glass beads are distributed as spacers throughout the display region between the two substrates to keep the gap or space therebetween constant. When similar spacers are used in a projection-type liquid crystal panel, shadows of spacers are projected when enlarged image projection is to be made. Thus, in case of a projection-type liquid crystal panel, glass beads, glass fibers, or the like are used as spacers after mixed into a substrate-sealing agent to be used around the display region. Accordingly, such a projection-type liquid crystal panel has such problems that the gap between the substrates will change even with a slight stress, when applied to the display region, particularly around the center, causing deterioration of display quality.

In a projection-type liquid crystal display device using three kinds of reflection-type liquid crystal display modules for red, green and blue, the liquid crystal display modules must be optically closely applied onto a dichroic prism for color splitting or color synthesis to prevent a contrast decrease of projected images due to the surface reflection on the liquid crystal panel.

Furthermore, such a structure as to maintain the liquid crystal display modules upon pressing onto the dichroic prism is used to prevent positional slipping of the optically closely applied three kinds of liquid crystal display modules during the use or transportation. However, the pressing force sometimes leads to such risks as generation of a compression force between the two substrates of the liquid crystal panel, resulting in a change in the gap for liquid crystal layer and consequent uneven display or panel breakage.

Still furthermore, there are such problems that the conductive paste, which is employed for the above-mentioned electrical connection at the contact 5, expands or contracts due to the heat applied to cure the conductive paste, changes of the circumstance, or an external force, resulting in development of a stress between the two substrates, changing the gap and deteriorating the display quality. The uneven display appears not only as an initial failure, but sometimes appears also as a slow failure with time.

Still furthermore, the above-mentioned structure of the conventional liquid crystal panel has such problems, when driving substrate 2 as the second substrate is fixed to package 7 by adhesive layer 6, that the uneven thickness of adhesive layer, a stress developed when the adhesive layer is applied to the second substrate or a stress developed due to a difference in the coefficient of thermal expansion between second substrate 2 and adhesive layer 6 gives rise to an uneven density of displayed images output from the liquid crystal panel, the uneven density looking like the shape of adhesive layer.

An object of the present invention is to provide a liquid crystal display module in such a structure as not to give any influence on the gap for liquid crystal layer between two substrates even if a stress is applied to a liquid crystal display package.

Another object of the present invention is to provide a liquid crystal display module using an improved flexible printed substrate for supplying power.

Another object of the present invention is to provide a projection-type liquid crystal display device using the above-mentioned liquid crystal module.

According to one aspect of the present invention, there is provided a liquid crystal display device having a liquid crystal display module, the liquid crystal display module including a liquid crystal panel having at least a first substrate, a second substrate opposed to the first substrate and a liquid crystal layer provided in a space between the first and second substrates, a flexible substrate electrically connected to the second substrate and a package for encasing and holding the liquid crystal panel, wherein:

each of at least two sides of the first substrate has a side edge extruding outwardly over a corresponding side end of the second substrate;

a connection member is provided at one side of the second substrate to extrude outwardly from one side of the first substrate for connection with the flexible substrate; and the liquid crystal panel is fixed to the package by the side edges of the first substrate.

By the above structure, the liquid crystal panel is fixed to the package through the first substrate mechanically coupled to the package, so that a stress applied to the package is not transferred to the second substrate. As a result, no substantial change will be caused to a gap or a space between the first and second substrates to thereby suppress degradation of display quality.

According to another aspect of the present invention, there is provided a liquid crystal display device having a reflection-type liquid crystal display module, the liquid crystal display module including a liquid crystal panel having at least a first substrate, a second substrate opposed to the first substrate and a liquid crystal layer provided in a space between the first and second substrates, a flexible substrate electrically connected to the second substrate, a package for encasing and holding the liquid crystal panel and a glass plate or a lens closely contacted to the liquid crystal panel, wherein:

each of at least two sides of the first substrate has a side edge extruding outwardly over a corresponding side end of the second substrate;

a connection member is provided at one side of the second substrate to extrude outwardly from one side of the first substrate for connection with the flexible substrate; and the side edges of the first substrate are fixed to the package, whereby the second substrate is supported by the first substrate and not by the package.

According to another aspect of the present invention, there is provided a projection-type liquid crystal projector comprising reflection-type liquid crystal display modules each including a liquid crystal panel mounted on a package and having a liquid crystal layer arranged between a first substrate and a second substrate, a flexible substrate for supplying signals to the liquid crystal panel, a dichroic prism to which the reflection-type liquid crystal display modules are attached, a light source for illuminating the respective reflection-type liquid crystal display modules through the dichroic prism and an optical system for projecting reflected lights from the respective reflection-type display modules onto a screen, wherein, in each of the reflection-type liquid crystal display modules:

each of at least two sides of the first substrate has a side edge extruding outwardly over a corresponding side end of the second substrate;

a connection member is provided at one side of the second substrate to extrude outwardly from one side of the first substrate for connection with the flexible substrate; and side edges of the first substrate are fixed to the package, whereby the second substrate is supported by the first substrate and not by the package.

By the above structure, pressing force applied to the package is transmitted to the dichroic prism through the side edge of the first substrate so that the optical close contact between first substrate and the dichroic prism will be increased. Further, since the second substrate is supported by the first substrate and not by the package, no substantial change will be caused to a gap or a space between the first and second substrates to thereby suppress degradation of display quality.

According to another aspect of the present invention, there is provided a liquid crystal display device comprising a liquid crystal panel having at least a first substrate, a second substrate opposed to the first substrate and a liquid crystal layer provided in a space between the first and second substrates, a package for encasing and holding the liquid crystal panel and flexible printed substrate for supplying signals to the liquid crystal panel, wherein:

each of at least two sides of the first substrate has a side edge extruding outwardly over a corresponding side end of the second substrate;

a connection member provided at one side of the second substrate to extrude outwardly from one side of the first substrate for connection with the flexible substrate;

the side edges of the first substrate are fixed to the package; and terminals provided on one end part of the flexible printed substrate and connected to the liquid crystal panel include first terminals electrically connected to the side edges of the first substrate and second terminals electrically connected to the second substrate.

According to another aspect of the present invention, there is provided a projection-type liquid crystal projector comprising reflection-type liquid crystal display modules each including a package, a liquid crystal panel having a liquid crystal layer arranged between a first substrate and a second substrate and a flexible substrate for supplying signals to the liquid crystal panel, the crystal panel and the flexible substrate being mounted on the package, the projector further comprising a dichroic prism to which the reflection-type liquid crystal display modules are attached, a light source for illuminating the respective reflection-type liquid crystal display modules through the dichroic prism and an optical system for projecting reflected lights from the reflection-type liquid crystal display modules onto a screen, the reflected lights being combined by the dichroic prism, wherein:

(a) in each of the reflection-type liquid crystal display modules each of at least two sides of the first substrate has a side edge extruding outwardly over a corresponding side end of the second substrate, a connection member provided at one side of the second substrate to extrude outwardly from one side of the first substrate for connection with the flexible substrate, and the side edges of the first substrate are fixed to the package, whereby the second substrate is supported by the first substrate and not by the package;

and (b) terminals provided on one end part of the flexible printed substrate and connected to the liquid crystal panels include first terminals electrically connected to the side edges of the first substrates and second terminals electrically connected to the second substrates.

By the above structure, it is possible with a single flexible printed substrate to make direct connection to electrodes arranged on both sides of the single flexible printed substrate, which is free from changes of a gap or a space for a liquid crystal layer heretofore caused by local stress at the electrical connection portions for the first and second substrates by use of conductive paste or caused by externally applied force to the whole first and/or second substrates.

Further, by the above structure, even when liquid crystal panels are kept in pressed contact against the dichroic prism with substantial pressing force, no substantial change will be caused to a gap or a space between the first and second substrates to thereby maintain a projection display image of high quality.

DESCRIPTION OF THE PREFERRED EMBODIMENTS

Figure 1:
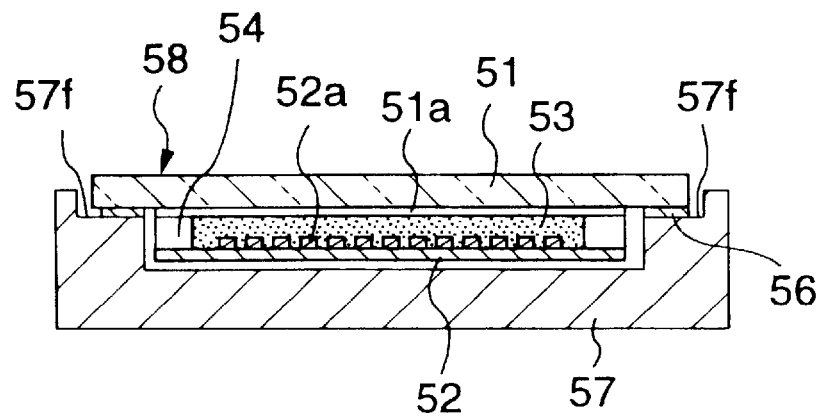
FIG. 1 is a cross-sectional view of a liquid crystal display module according to one embodiment of the present invention.
Figure 2:
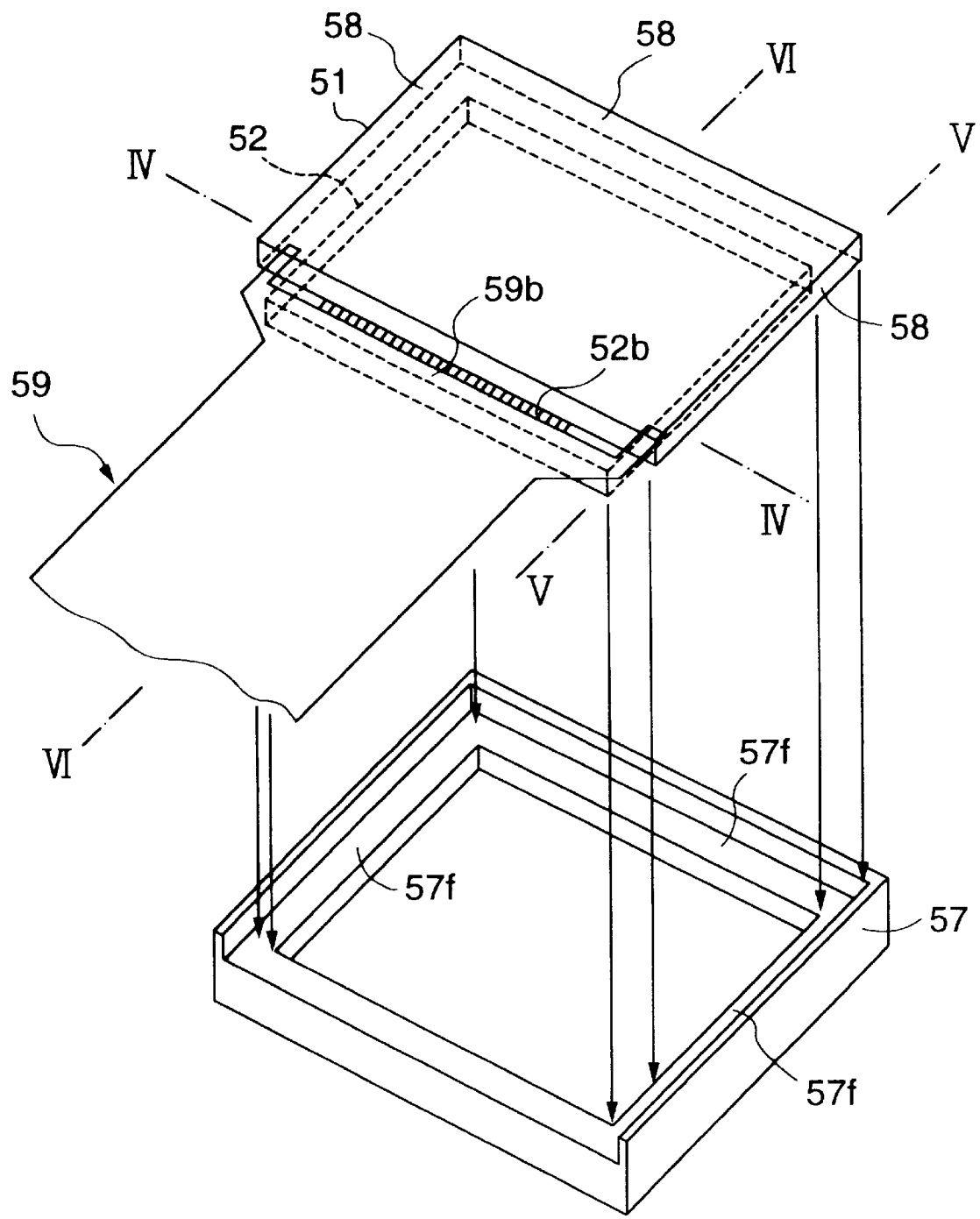
FIG. 2 is an expanded perspective view of the liquid crystal display module of FIG. 1.

In FIG. 1 showing a cross-sectional view of a liquid crystal display module according to one embodiment of the present invention and FIG. 2 showing an expanded perspective view of the liquid crystal display module of FIG. 1, numeral 51 designates a transparent substrate of, for example, generally rectangular shape (which is a common substrate and may be hereinafter referred to as a first substrate), 51a a common electrode provided on the back side of substrate 51, 52 a silicon substrate of, for example, a generally rectangular shape (which is a driving plate and may be hereinafter referred to as second substrate), 53 a liquid crystal layer, 54 a seal for sealing the liquid crystal between the first and second substrates, 56 an adhesive, 57 a package and 59 a flexible printed substrate for supplying power.

As shown in FIGS. 1 and 2, side edges 58 of at least two opposite sides (in this embodiment, three sides as shown in FIG. 2) of first substrate 51 of liquid crystal panel are extruded at the side edges over corresponding side ends of second substrate 52, and second substrate 52 is fixed to first substrate 51 by seal 54. The remaining one side of first substrate 51 serves as a fixing side to flexible printed substrate 59. The second substrate-facing sides 52, 58 of the first substrate 51 are fixed to recess edges 57f of package 57. Second substrate 52 is fixed to first substrate 51 by seal 54, and not fixed to package 57.

Figure 9:
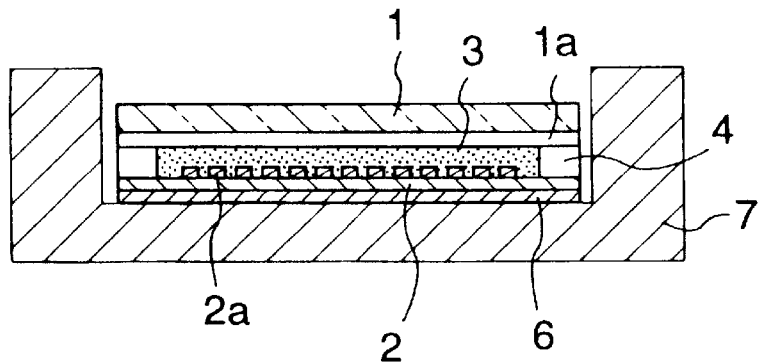
FIG. 9 is a cross-sectional view along line IX—IX in FIG. 8.
Figure 10:
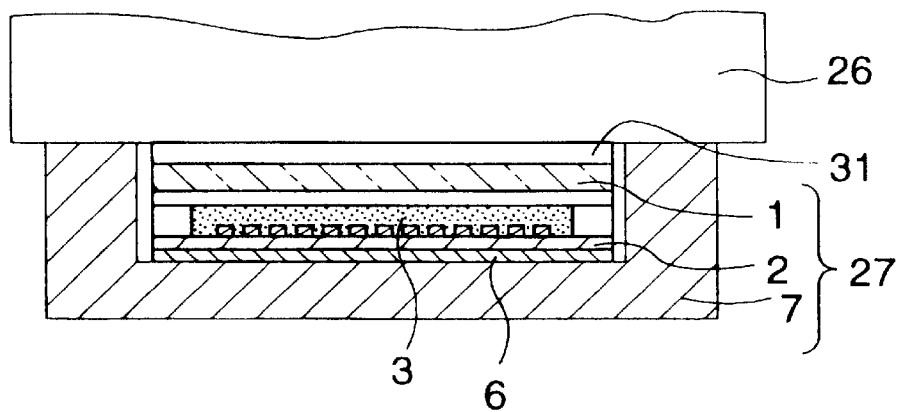
FIG. 10 is a cross-sectional view showing one structure of a reflection-type liquid crystal display module, where the liquid crystal panel shown in FIG. 8 is fixed to a package, as attached onto a dichroic prism.
Figure 11:
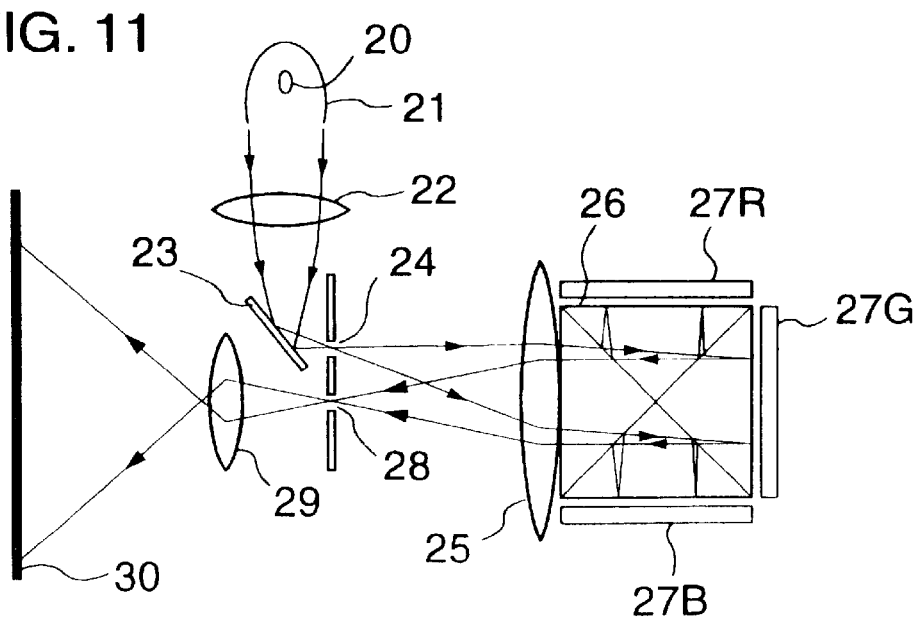
FIG. 11 is a schematic view of an optical system to which a projection-type liquid crystal display device using liquid crystal display modules according to embodiments of the present invention is applicable.

In the conventional liquid crystal display module as shown in FIG. 9, second substrate 2 is fixed to package 7 by thermosetting type adhesive layer 6 to make a reflection-type liquid crystal display module, and first substrate 1 is tightly fixed to or closely attached to dichroic prism 26 by optical paste 31, as shown in FIG. 11. Thus, when a force is applied to the package, first substrate 1 and second substrate 2 are compressed between package 7 and dichroic prism 26 to change the gap for liquid crystal layer. In this embodiment, on the other hand, a force applied to the package acts as if it would press only first substrate 51 onto the dichroic prism, and thus there is no such change in the gap or space as observed in the conventional liquid crystal display module.

Furthermore, uneven image display can be prevented which have hitherto been caused by fixing the back side of second substrate to package 57 by an adhesive.

Figure 3:
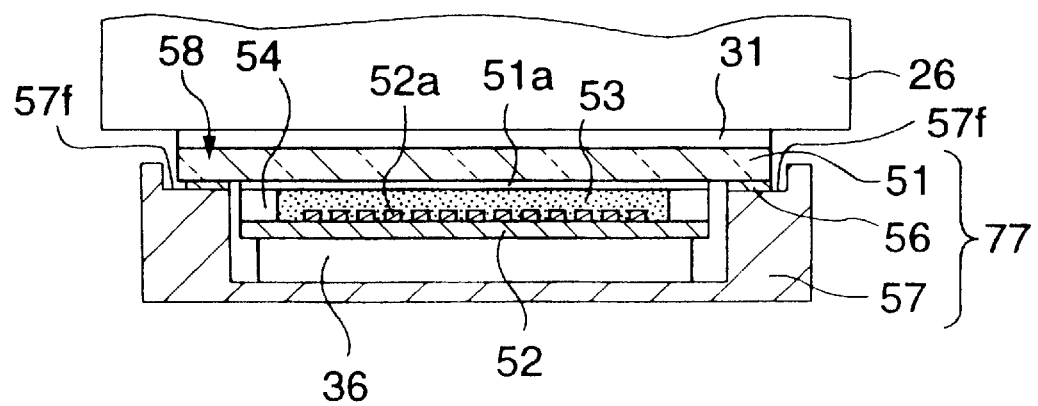
FIG. 3 is a cross-sectional view showing one structure of a liquid crystal display module according to one embodiment of the present invention, as attached onto a dichroic prism.

In FIG. 3 showing a cross-sectional view of one structure of a liquid crystal display module according to one embodiment of the present invention, as attached onto a dichroic prism, numeral 51 designates a first substrate, 52 a second substrate, 53 a liquid crystal layer, 56 an adhesive, 57 a package, 58 side edges of first substrate, 26 a dichroic prism, 77 a reflection-type liquid crystal display module, 31 an optical paste and 36 a heat dissipating sheet having a high thermal conductivity and a high elasticity made of, for example, an elastomer.

When use is made of color filters without using dichroic prism 26 for color separation, liquid crystal panels may be fixed to an anti-reflection coated glass plate or a lens with a silicone oil or the like having a refractive index substantially identical with that of the glass plate coated thereon.

In FIG. 9, the liquid crystal panel and package 57 are fixed to each other by fixing side edges 58 of first substrate 57 of liquid crystal panel to recess edges 57f of package 57 by adhesive 56 to make reflection-type liquid crystal display module 77, and furthermore first substrate 51 is closely attached to dichroic prism 26 by optical paste 31.

The liquid crystal layer for use in the present invention comprises a polymer dispersion-type liquid crystal (PDLC), where liquid crystal materials are dispersed in a macromolecule matrix, and undergoes a change from a light-scattering state to a light-transmitting state, depending on an applied voltage. Accordingly, the reflection-type liquid crystal panel using the liquid crystal layer can form images on the basis of a change of the liquid crystal layer between a light-scattering state and a mirror reflection state at reflecting pixel electrode formed on the second substrate, depending on a voltage applied to the liquid crystal layer.

As optical paste 31, silicone oil, etc. having an approximately equal refractive index to that of dichroic prism 26 is used to prevent generation of reflected light at the boundary between first substrate 51 and dichroic prism 26, and consequent light intensity loss, projected image contrast decrease, etc.

For adhesive 56, it is desirable to use ultraviolet-curing type resin or thermosetting resin, and for package 57 it is desirable to use materials having a similar coefficient of thermal expansion to that of first substrate 51, for example, ceramics or liquid crystal polymers in case the first substrate is made of barium borosilicate glass. By virtue of the structure of this embodiment, even if package 51 is pressed against or attached to dichroic prism 26, no corresponding pressing force acts on second substrate 52 and thus no change in the gap or space for liquid crystal layer occurs. Accordingly, the projection-type liquid crystal display device using these liquid crystal display modules can maintain projected images of high image quality. To obtain a good heat radiation effect, heat dissipating sheet 36 of elastomer or the like, which has a high thermal conductivity and a good elasticity, may be uniformly filled in the space between second substrate 52 and package 57, as shown in FIG. 3.

Figure 4:
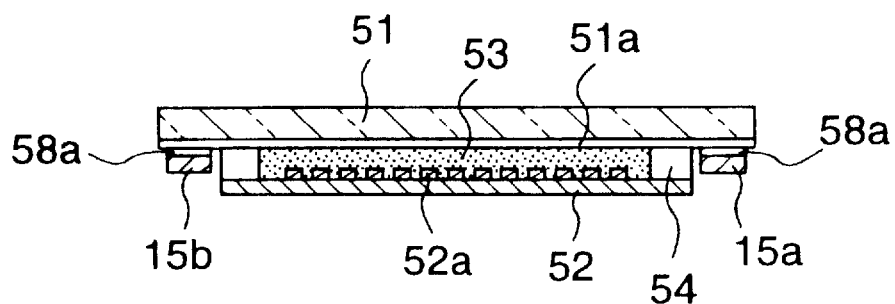
FIG. 4 is a cross-sectional view along line IV—IV of FIG. 2.
Figure 5:
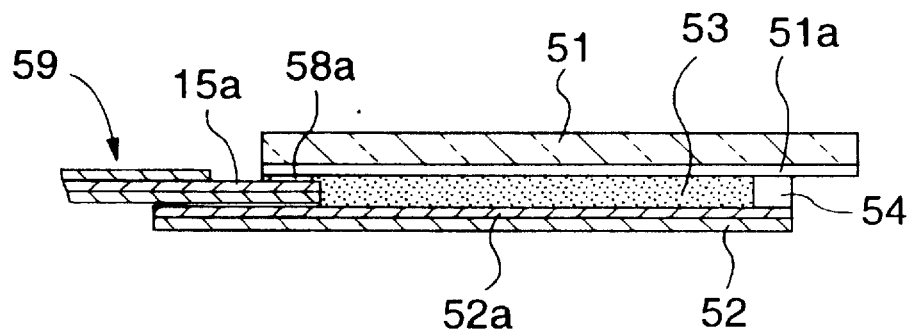
FIG. 5 is a cross-sectional view along line V—V in FIG. 2.
Figure 6:
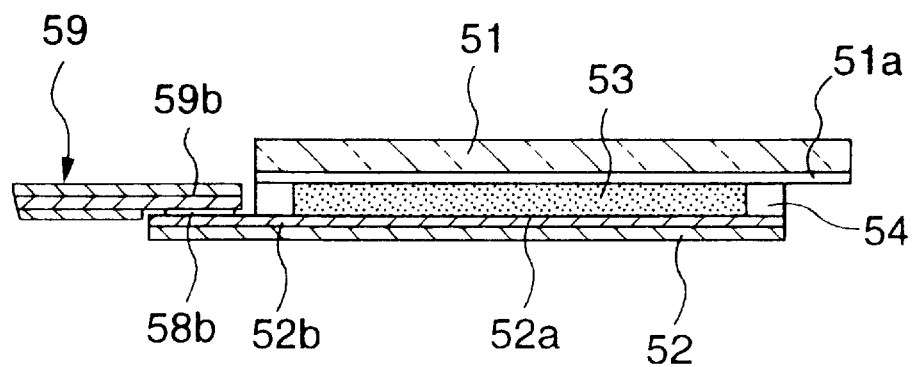
FIG. 6 is a cross-sectional view along line VI–IV in FIG. 2.

In FIG. 4 showing a cross-sectional view along line IV—IV of FIG. 2, FIG. 5 showing a cross-sectional view along line V—V of FIG. 2 and FIG. 6 showing a cross-sectional view along line VI—VI of FIG. 2, numerals 58a and 58b designate anisotropic conductive films, 15a and 15b common electrode connection terminals, and 59b driving electrode connection terminals (pixel electrode connection terminals) of pixel electrode 52a.

Figure 8:
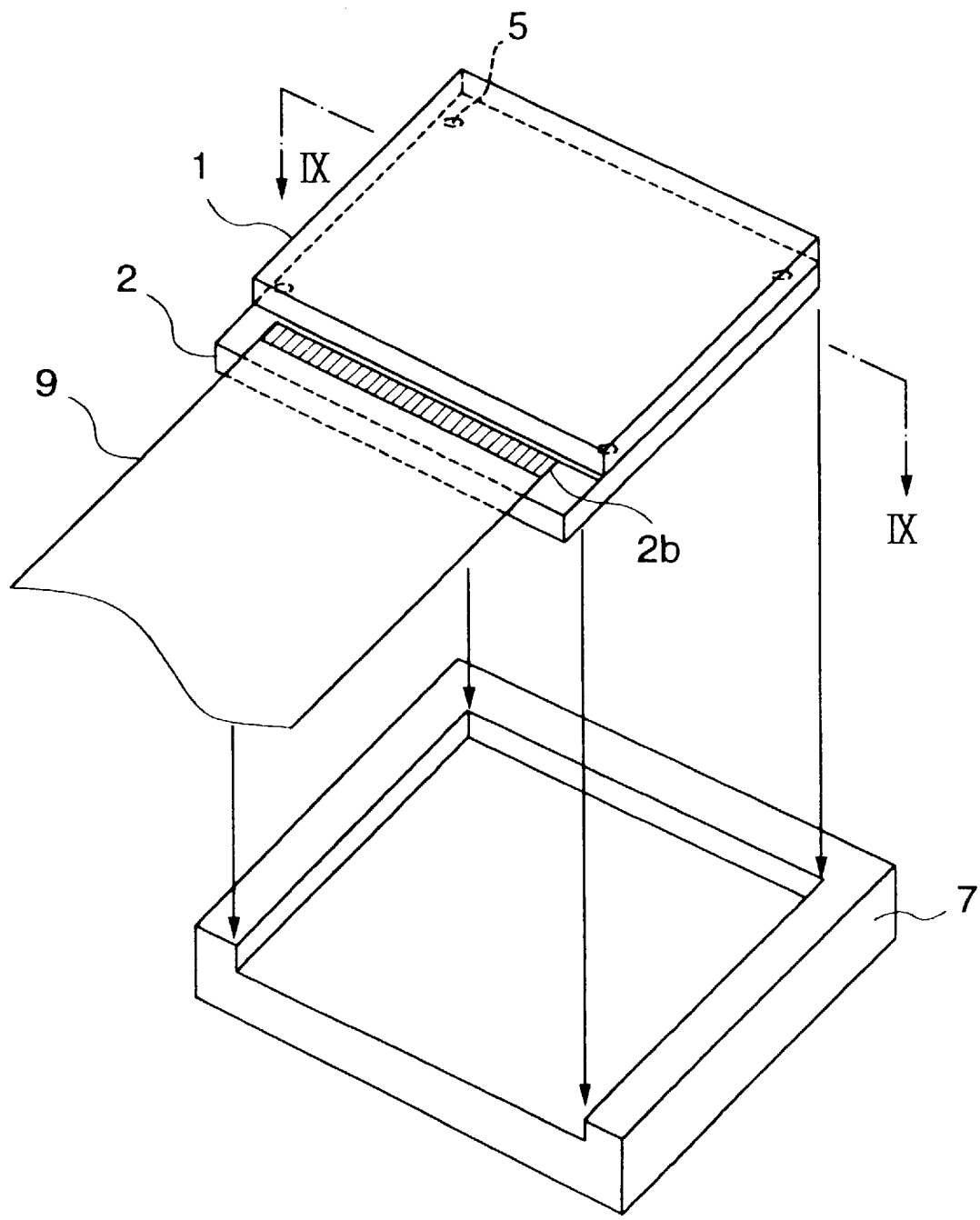
FIG. 8 is an expanded perspective view showing one structure of the conventional small size, liquid crystal panel.

In this embodiment, common electrode 51a formed on first substrate 51 (FIG. 2) and lead conductors 52b of driving electrodes 52a formed on second substrate 52 are connected to common electrode connection terminals 15a and 15b and driving electrode terminals 59b, respectively, formed on the terminal part of one flexible printed substrate 59 through anisotropic conductive films 58a and 58b. That is, common electrode connection terminals 15a and 15b are so formed as to expose their conductor surfaces on the first substrate 51-facing side of flexible printed substrate 59, whereas a plurality of driving electrode connection terminals 59b are so formed as to expose their conductor surfaces on the second substrate 52-facing side (opposite side to that of the first substrate) of flexible printed substrate 59. Common electrode connection terminals 15a and 15b are connected to common electrode 51a of first substrate 51 through anisotropic conductive films 58a, whereas a plurality of driving electrode connection terminals 59b are connected to the driving electrode extensions 52b through anisotropic conductive film 58b. Other structural members than above are identical with those of the conventional liquid crystal panel explained with reference to FIG. 8, and thus their explanation will be omitted.

Since no conductive paste as in the conventional art is used in the present invention for electrical connection of common electrode 51a of first substrate 51 and of pixel electrodes of second substrate 52, no local stress due to the electrical connection structure of both substrates is developed.

By virtue of this structure, a change in the gap or space for liquid crystal layer due to the local stress at the corresponding conductive connections between the first and second substrates by the conventional conductive paste or an external force on the whole substrates can be eliminated, ensuring an image display of high quality.

Figure 7A:
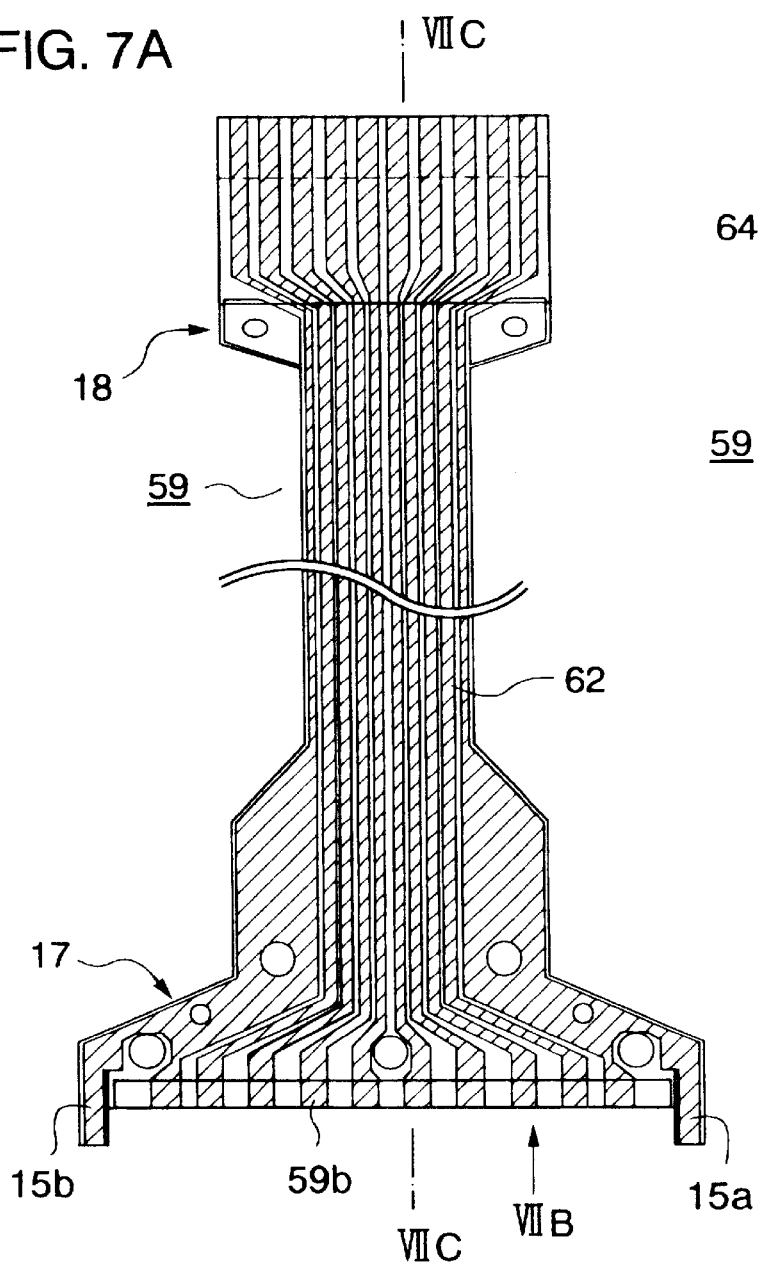
FIGS. 7A to 7C are views showing a flexible substrate according to one embodiment of the present invention.
Figure 7C:
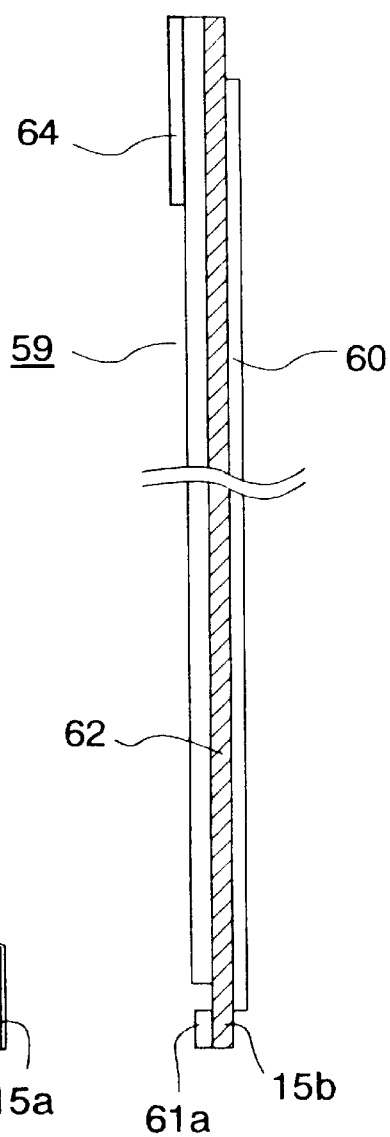
Figure 7B:
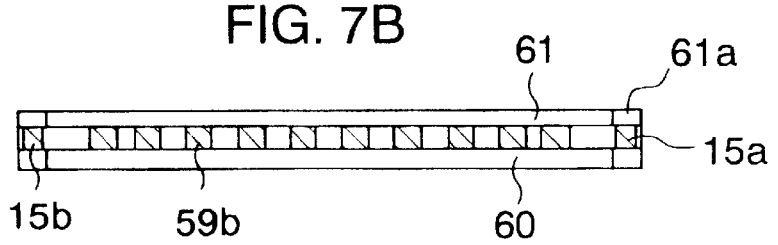

In FIGS. 7A to 7C showing views of a flexible printed substrate according to one embodiment of the present invention, i.e. FIG. 7A showing a plan view, FIG. 7B showing a front elevation view from line B—B of FIG. 7A and FIG. 7C showing a cross-sectional side view along line VIIC—VIIC of FIG. 7A, numeral 59 designates a flexible printed substrate, 60 a flexible base film, 61 a flexible cover film, 61a a flexible cover film for the common electrode connection terminals, 62 conductive filaments, 64 a reinforcing film, 15a and 15b common electrode connection terminals and 59b driving electrode connection terminals.

As shown in FIGS. 7A to 7C, the flexible printed substrate 59 has a large number of conductive filament conductors 62 between flexible base film 60 and flexible cover film 61, the conductive filament conductors 62 having terminal parts 17 and 18 at both ends. The conductive filament conductors provided at both ends in the width direction of one terminal part 17 are exposed on the flexible base film 60 side thereof to serve as the common electrode connection terminals, whereas the remaining conductive filament conductors are exposed on the flexible cover film 61 side thereof to serve as driving electrode connection terminals.

The common electrode connection terminals 15a and 15b and driving electrode connection terminals 59b on one terminal part 17 of flexible printed substrate are overlaid on and connected to common electrode 51a of first substrate 51 and driving electrode lead terminals 52b of second substrate 52, respectively, through anisotropic conductive films 58a and 58a, as shown in FIGS. 5 and 6.

Reinforcing film 64 is pasted on other terminal part 18 to prevent deformation of the terminal part. The reinforcing film can be pasted also on terminal part 17 to reinforce the terminal part 17.

Such a single flexible printed substrate can be connected to counterposed terminals positioned on the common electrode connection terminals 15a and 15b side and the driving electrode connection terminals 59b side, respectively, at the same time.

In the foregoing embodiments of liquid crystal panel, a macromolecule dispersion-type liquid crystal is used for the liquid crystal layer, but the present invention is not limited thereto. A liquid crystal panel using now generally available TN (twisted nematic) liquid crystal may be likewise used in the present invention. The present invention is not limited only to the reflection-type liquid crystal display modules, but applicable also to a transmission-type liquid crystal panel likewise, when a transparent substrate is used as a second substrate to make the package a transmission-type.

As described above, the projection-type liquid crystal display device using liquid crystal display modules undergoes no change in the gap or space for liquid crystal layer due to the necessary force for mounting the modules onto a dichroic prism, and accordingly enlarged images of high quality can be obtained.

We claim:

1. A liquid crystal display device having a liquid crystal display module, said liquid crystal display module including a liquid crystal panel having at least a first substrate, a second substrate opposed to the first substrate and a liquid crystal layer provided in a space between the first and second substrates, a flexible substrate electrically connected to the second substrate and a package for encasing and holding the liquid crystal panel, wherein:

each of at least two sides of the first substrate has a side edge extruding outwardly over a corresponding side end of the second substrate;

a connection member is provided at one side of the second substrate to extrude outwardly from one side of the first substrate for connection with the flexible substrate; and the liquid crystal panel is fixed to the package by the side edges of the first substrate.

2. A liquid crystal display device having a reflection-type liquid crystal display module, said liquid crystal display module including a liquid crystal panel having at least a first substrate, a second substrate opposed to the first substrate and a liquid crystal layer provided in a space between the first and second substrates, a flexible substrate electrically connected to the second substrate, a package for encasing and holding the liquid crystal panel and a glass plate or a lens closely contacted to said liquid crystal panel, wherein:

each of at least two sides of the first substrate has a side edge extruding outwardly over a corresponding side end of the second substrate;

a connection member is provided at one side of the second substrate to extrude outwardly from one side of the first substrate for connection with the flexible substrate; and the side edges of the first substrate are fixed to the package, whereby the second substrate is supported by the first substrate and not by the package.

3. A projection-type liquid crystal projector comprising reflection-type liquid crystal display modules each including a liquid crystal panel mounted on a package and having a liquid crystal layer arranged between a first substrate and a second substrate, a flexible substrate for supplying signals to the liquid crystal panel, a dichroic prism to which the reflection-type liquid crystal display modules are attached, a light source for illuminating the respective reflection-type liquid crystal display modules through the dichroic prism and an optical system for projecting reflected lights from the respective reflection-type display modules onto a screen, wherein, in each of said reflection-type liquid crystal display modules:

each of at least two sides of the first substrate has a side edge extruding outwardly over a corresponding side end of the second substrate;

a connection member is provided at one side of the second substrate to extrude outwardly from one side of the first substrate for connection with the flexible substrate; and side edges of the first substrate are fixed to the package, whereby the second substrate is supported by the first substrate and not by the package.

4. A liquid crystal display device comprising a liquid crystal panel having at least a first substrate, a second substrate opposed to the first substrate and a liquid crystal layer provided in a space between the first and second substrates, a package for encasing and holding the liquid crystal panel and flexible printed substrate for supplying signals to the liquid crystal panel, wherein:

each of at least two sides of the first substrate has a side edge extruding outwardly over a corresponding side end of the second substrate;

a connection member is provided at one side of the second substrate to extrude outwardly from one side of the first substrate for connection with the flexible substrate;

the side edges of the first substrate are fixed to the package; and terminals provided on one end part of the flexible printed substrate and connected to the liquid crystal panel include first terminals electrically connected to the side edges of the first substrate and second terminals electrically connected to the second substrate.

5. A projection-type liquid crystal projector comprising reflection-type liquid crystal display modules each including a package, a liquid crystal panel having a liquid crystal layer arranged between a first substrate and a second substrate and a flexible substrate for supplying signals to the liquid crystal panel, the crystal panel and the flexible substrate being mounted on the package, the projector further comprising a dichroic prism to which the reflection-type liquid crystal display modules are attached, a light source for illuminating the respective reflection-type liquid crystal display modules through the dichroic prism and an optical system for projecting reflected lights from the reflection-type liquid crystal display modules onto a screen, said reflected lights being combined by the dichroic prism, wherein:

(a) in each of said reflection-type liquid crystal display modules each of at least two sides of the first substrate has a side edge extruding outwardly over a corresponding side end of the second substrate, a connection member is provided at one side of the second substrate to extrude outwardly from one side of the first substrate for connection with the flexible substrate, and the side edges of the first substrate are fixed to the package, whereby the second substrate is supported by the first substrate and not by the package; and (b) terminals provided on one end part of the flexible printed substrate and connected to the liquid crystal panels include first terminals electrically connected to the side edges of the first substrates and second terminals electrically connected to the second substrate.

* * * * *